(12) United States Patent
Saegusa et al.

(10) Patent No.: US 8,303,796 B2
(45) Date of Patent: Nov. 6, 2012

(54) METHOD FOR PRODUCING SILICON

(75) Inventors: Kunio Saegusa, Tsukubamirai (JP); Tetsuo Oishi, Tsukuba (JP); Kazuya Koyama, Tsukuba (JP)

(73) Assignees: Sumitomo Chemical Company, Limited, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 655 days.

(21) Appl. No.: 12/302,466

(22) PCT Filed: May 25, 2007

(86) PCT No.: PCT/JP2007/060714
§ 371 (c)(1),
(2), (4) Date: Nov. 25, 2008

(87) PCT Pub. No.: WO2007/139023
PCT Pub. Date: Dec. 6, 2007

(65) Prior Publication Data
US 2010/0059118 A1    Mar. 11, 2010

(30) Foreign Application Priority Data

May 26, 2006   (JP) ................................ 2006-146386

(51) Int. Cl.
*C25B 1/00*     (2006.01)
*C25C 3/34*     (2006.01)
*C01B 33/02*    (2006.01)

(52) U.S. Cl. ........ 205/410; 204/250; 204/293; 205/915; 423/349

(58) Field of Classification Search .................. 136/261; 204/250, 293; 205/410, 915; 423/349
See application file for complete search history.

(56) References Cited

U.S. PATENT DOCUMENTS

| 4,292,145 | A | * | 9/1981 | De Mattei et al. ............ 205/410 |
| 4,525,334 | A |   | 6/1985 | Woditsch et al. |
| 4,919,913 | A |   | 4/1990 | Kurz et al. |
| 2004/0108218 | A1 |   | 6/2004 | Stubergh |

FOREIGN PATENT DOCUMENTS

| JP | 97/27143 A1 | 7/1997 |
| JP | 2004-523660 A | 8/2004 |
| WO | WO-95/33870 A1 | 12/1995 |
| WO | WO-02/077325 A1 | 10/2002 |

OTHER PUBLICATIONS

D. Elwell and G. Rao. "Electrolytic production of silicon." Jan. 1988. Journal of Applied Electrochemistry. vol. 18, Issue 1. pp. 15-22.*
E. Good, T. Wang, T. Ciszek, R. Frost, M. Page, and M. Landry. "Partitioning effects in recrystallization of silicon from silicon-metal solutions." Aug. 2002. 12th Workshop on Crystalline Silicon Solar Cell Materials and Processes. pp. 231-234.*
Yoshizawa et al., Journal of the chemical society of the Japan; Kogyo Kagaku Zassi 64 (8), pp. 1347-1350 (1961).
Blocher et al., Evaluation of selected chemical processes for production of low-cost silicon; Jet propulsion laboratory final report (1981).
By Shin-Etsu Chemical Co., Ltd., Solar-electric power generation system commercialization technology development: Low-cost silicon experiment refinement study, summary of report on commissioned project of New energy and Industrial technology development organization, (1988) pp. 1-227.
Grjotheim et al., Canadian Metallurgical Quarterly, vol. 10, No. 2, pp. 79-82 (1971).
Boe at al., Canadian Metallurgical Quarterly, vol. 10, No. 3, p. 179-183 (1971).
Boe at al., Canadian Metallurgical Quarterly, vol. 10, No. 4, pp. 281-285 (1971).
Frazer et al., Electrochimica Acta, 1977, vol. 22, pp. 1179-1182.
De Mattei et al., J. Electrochem. Soc., vol. 128, No. 10, pp. 1712-1714 (1982).

* cited by examiner

*Primary Examiner* — Arun S Phasge
*Assistant Examiner* — Steven A. Friday
(74) *Attorney, Agent, or Firm* — Birch, Stewart, Kolasch & Birch, LLP

(57) ABSTRACT

Disclosed is a novel method for producing high-purity silicon at low cost. Particularly disclosed is a novel method for producing high-purity silicon, which can be suitably used as a raw material for solar cells, at low cost. Specifically, a method for producing silicon wherein silica is subjected to molten salt electrolysis in an electrolysis vessel comprises, in the following order, a step (1) wherein the silicon content in an silicon-containing alloy, which is in a liquid phase at the electrolysis temperature, is increased by using the alloy as the cathode and performing electrolysis; a step (2) wherein the silicon-containing alloy serving as the cathode is taken out of the electrolysis vessel before it reaches the concentration at which silicon begins to precipitate at the electrolysis temperature; a step (3) wherein silicon is solidified by cooling the taken-out silicon-containing alloy within the temperature range higher than the eutectic point but lower than the electrolysis temperature; and a step (4) wherein the solidified silicon is collected.

11 Claims, No Drawings

METHOD FOR PRODUCING SILICON

TECHNICAL FIELD

The present inventions generally relate to a method for producing silicon, and more specifically, to solar-grade silicon.

BACKGROUND OF THE INVENTION

Metallurgy-grade silicon is produced by mixing carbon and quartzite and reducing the mixture in an arc furnace. The metallurgy-grade silicon is reacted with HCl to synthesize trichlorosilane, the trichlorosilane is distilled and refined, and then reduced with hydrogen at a high temperature to produce semiconductor-grade silicon. Solar-grade silicon has been mainly made of off-spec grade material supplied in producing the semiconductor-grade silicon.

While the method for producing the semiconductor-grade silicon as described above can form silicon with extremely high purity, the method requires high cost for the reasons that the rate of conversion into silicon is low and a large amount of hydrogen is required to achieve equilibrium advantageous for silicon, a large amount of unreacted gas needs to be recirculated for use because the conversion rate is still low, various types of halogenated silane produced in the unreacted gas require separation by distillation, a large amount of silicon tetrachloride which cannot be reduced ultimately with hydrogen is produced, and the like.

A solar cell has received attention as a predominant means for solving environmental issues such as carbon dioxide in recent years and has been rapidly growing in demand. The solar cell, however, is expensive at present and thus provides electric power at prices which are several times higher than the charge for electricity of commercial electric power. Since the demand for the solar cell is growing in response to the environmental issues and an increasing demand for energy, only the conventional irregular items of semiconductor silicon cannot provide a sufficient amount of a raw material of the solar cells, so that there is a need to supply a large amount of low-cost material of the solar cells.

In order to solve the above problems, a method for synthesizing highly pure carbon and highly pure silica, and then reducing it in a reduction furnace with a highly pure furnace material to synthesize highly pure silicon has already been proposed. The method, however, causes problems such as difficulty in scale-up, a low yield, and difficulty in reducing cost. Another method for reducing silicon tetrachloride with aluminum has been also proposed (see the following Non-patent Document 1, Patent Document 1, and Patent Document 2). However, in this method phosphorus in aluminum remains in silicon and makes it difficult to achieve a desired purity.

Other proposals have been made such as a method of reduction of silicon tetrachloride with zinc (see the following Non-patent Document 2) and reduction of trichlorosilane in a fluidized bed (see the following Non-patent Document 3), but none of them have been put in practical use.

A method for producing silicon by electrolysis of silica has been also studied.

Non-Patent Document 1: Reduction of silicon tetrachloride with aluminum by YOSHIZAWA Shiro, HASHINO Tomoyasu, and SAKAGUCHI Shin, Journal of the Chemical Society of Japan, Kogyo kagaku zasshi 64(8) 1347-50 (1961)
Patent Document 1: JP-A-2-64006
Patent Document 2: JP-A-59-182221

Non-patent Document 2: Evaluation of selected chemical processes for production of low-cost silicon, J. M. Blocher, et al. Jet propulsion laboratory final report (1981)

Non-patent Document 3: Solar-electric power generation system commercialization technology development: Low-cost silicon experiment refinement study, Summary of report on commissioned project of New energy and industrial technology development organization (1980-1987), by Shin-Etsu Chemical Co., Ltd. (1988)

DISCLOSURE OF THE INVENTION

Problems to be Solved by the Invention

In a method for collecting silicon by molten salt electrolysis of silica, if electrolysis is performed at a temperature lower than the melting point of silicon (1410° C.), the electrolysis cannot be continued because silicon deposited on a cathode glows in a dendritic shape to cause a short circuit between electrodes. On the other hand, if the electrolysis is performed at a temperature equal to or higher than the melting point of silicon, the current efficiency is low due to reverse reaction of reduced metal and the like and industrialization is difficult because of difficulty such as lack of an appropriate furnace material.

It is an object of the present inventions to provide a novel and inexpensive method for producing highly pure silicon capable of solving the abovementioned problems, and highly pure silicon provided in the producing method, and more specifically, to provide a novel and inexpensive method for producing highly pure silicon used preferably for a raw material of solar cells.

Means for Solving the Problems

The present invention provides [1] a method for producing silicon by a molten salt electrolysis of silica in an electrolytic vessel with an electrolytic bath, including in order: a step (1) of using an alloy containing silicon in a liquid phase at an electrolysis temperature for a cathode and progressing the electrolysis to increase a content percentage of the silicon in the alloy; a step (2) of removing the alloy containing silicon in the cathode from the electrolysis vessel before the concentration of the silicon in the alloy becomes saturated at the electrolysis temperature; a step (3) of cooling the alloy containing silicon at temperatures higher than the eutectic point of the removed alloy containing silicon and lower than the electrolysis temperature to crystallize the silicon; and a step (4) of collecting the solidified silicon.

The present inventions also relate to [2] the method for producing silicon according to [1], further including a step (5) of returning the alloy containing silicon in which the concentration of the silicon is reduced due to the collection of silicon at the step (4) to the cathode in the electrolytic vessel;

[3] the method for producing silicon according to [1] or [2], wherein the alloy contains at least one metal selected from the group consisting of aluminum, copper, and tin;

[4] the method for producing silicon according to any one of [1] to [3], wherein the electrolytic bath in the molten salt electrolysis contains cryolite ($3NaF.AlF_3$);

[5] the method for producing silicon according to any one of [1] to [4], wherein the alloy liquid containing silicon has a specific gravity higher than a specific gravity of the electrolytic bath;

[6] the method for producing silicon according to any one of [1] to [4], wherein the alloy liquid containing silicon has a specific gravity lower than a specific gravity of the electrolytic bath;

[7] the method for producing silicon according to any one of [1] to [6], wherein the silica has a purity of 99.9% or higher;

[8] the method for producing silicon according to any one of [1] to [7], wherein the electrolysis temperature is higher than the eutectic point of the alloy containing silicon and lower than a melting point of the silicon;

[9] the method for producing silicon according to any one of [1] to [8], wherein the electrolysis temperature ranges from 700° C. to 1300° C.;

[10] the method for producing silicon according to any one of [1] to [9], wherein anode current density ranges from 0.01 to 3 $A/cm^2$;

[11] the method for producing silicon according to any one of [1] to [10], wherein cathode current density ranges from 0.01 to 3 $A/cm^2$;

[12] a silicon obtained in the method for producing silicon according to any one of [1] to [11]; and

[13] a solar cell including the silicon obtained in the method for producing silicon according to any one of [1] to [11].

Effects of the Invention

According to the production methods of the present inventions, silicon is once dissolved in the alloy liquid, removed from the electrolytic vessel, and cooled at the temperature equal to or higher than the eutectic point of the alloy to crystallize only silicon, thereby reducing the silicon concentration in the alloy liquid. The alloy liquid containing silicon in which the silicon concentration is reduced is returned to the electrolytic vessel, so that electrolysis can be performed to the saturated concentration of the silicon at the electrolysis temperature to increase the silicon concentration. The operation can progress the electrolytic reduction continuously.

Therefore, it is possible to prevent a short circuit due to electrodeposition of solid silicon to provide a stable electrode interface. According to the production methods of the present inventions, electrolysis of silicon can be stably and continuously performed at a temperature lower than the melting point of silicon. Thus, the production methods of the present inventions are extremely important from an industrial viewpoint.

Best Mode for Carrying Out the Invention

When electrolyzing silica to produce silicon, an alloy of silicon in a liquid state at an electrolysis temperature can be used as a cathode, thereby preventing silicon from being deposited in a dendritic shape as well as achieving a melting point lower than that of silicon alone. This allows electrolysis to be performed at a lower temperature. In addition, when continuing the electrolysis, the silicon concentration in the liquid silicon alloy can be increased. The alloy having the increased concentration of silicon is removed from an electrolytic vessel and is cooled in temperatures equal to or higher than the eutectic point of the alloy, so that silicon can be crystallized and collected thereby. The alloy having the silicon concentration reduced by crystallizing silicon and collecting it is returned to the cathode in the electrolytic vessel and is used as the liquid cathode for electrolysis. Thus, the process in which electrolysis can be performed continuously is realized.

According to the production methods of the present inventions, an alloy containing silicon in a liquid phase at an electrolysis temperature is used as a cathode (hereinafter referred to as a cathode alloy) in a method for producing silicon by the molten salt electrolysis of silica in an electrolytic vessel.

An alloy composed of silicon and metal which forms the alloy having a low eutectic point with the silicon is used as the cathode in the present inventions, and the alloy becomes liquid under the electrolysis conditions. It is preferable that the alloy has a low vapor pressure and is stable.

The metals such as aluminum, copper, tin, gallium, indium, silver, mercury, and lead can be used to form the above alloy. In view of the cost and the environmental effects, a metal selected from the group consisting of aluminum, copper, and tin is preferable, and the alloy may contain two or more of the metals.

A metal used in the present inventions preferably has a purity of 4N or higher, more preferably 6N or higher, and particularly preferably 7N or higher. Specifically, each content of P and B is preferably 0.5 ppm or lower, more preferably 0.3 ppm or lower, and particularly preferably 0.1 ppm or lower.

Silica which is used as a material in the present inventions preferably has a high purity. The purity of silica is preferably 4N or higher, more preferably 6N or higher, and particularly preferably 7N or higher. Specifically, the content of each of P and B is preferably 0.5 ppm or lower, more preferably 0.3 ppm or lower, and particularly preferably 0.1 ppm or lower.

The electrolytic bath used in the present inventions is preferably metal halides. The metal halides used is preferably one or two or more selected from the group consisting of fluorides of alkali metal, alkaline earth metal, aluminum, zinc, copper; chlorides of alkali metal, alkaline earth metal, aluminum, zinc, copper; bromides of alkali metal, alkaline earth metal, aluminum, zinc, copper. Specific examples thereof include cryolite ($3NaF.AlF_3$) and calcium chrolide for the reasons that the industrial availability is easy.

The purity of the material constituting the electrolytic bath used in the present inventions is preferably 4N or higher, more preferably 6N or higher, and particularly preferably 7N or higher. Specifically, the content of each of P and B is preferably 0.5 ppm or lower, more preferably 0.3 ppm or lower, and particularly preferably 0.1 ppm or lower.

In the present inventions, since alkali metal and alkaline earth metal are hardly mixed in silicon under electrolysis conditions, they do not need to be considered as impurities. The elements constituting the cathode alloy do not need to be considered as impurities.

In the present inventions, as the density of electrolysis current is high, a large amount of silicon per time is produced and therefore the efficiency is high. However, an extremely high electrolysis current density increases the electrolysis voltage, resulting in loss of energy. The current density depends on the composition of the electrolytic bath, the temperature, the concentration of dissolved silica and the like, and is generally 0.01 to 3 $A/cm^2$ as a cathode current density, more preferably, 0.05 to 1 $A/cm^2$, and most preferably 0.1 to 0.7 $A/cm^2$.

In the present inventions, the electrolysis temperature is properly selected according to the composition of the cathode alloy. Specifically, the electrolysis temperature is properly selected in temperatures higher than the temperature (eutectic point) at which the cathode alloy becomes a liquid and lower than the melting point of silicon. When the electrolysis temperature is lower than the melting point of silicon, the current efficiency is more improved and the selection of the material for the electrolytic vessel is widened. When exceeding the eutectic point, the electrolysis is more likely to proceed. As the electrolysis temperature is higher, the solubility of silicon in the cathode alloy increases to produce a larger amount of silicon. For example, when aluminum-silicon is used as the cathode alloy, the eutectic point is 577° C. The electrolysis temperature is preferably set in a temperature which is higher than 577° C. and lower than 1410° C. The temperature preferably ranges 700° C. or higher to 1300° C. or lower, more preferably 800° C. or higher to 1200° C. or lower, and most preferably 900° C. or higher to 1100° C. or lower. The operation can be performed at an economically optimal temperature in the range.

In the present inventions, the recovery temperature of the cathode alloy is higher than the eutectic point of the cathode alloy. At a temperature equal to or lower than the eutectic point, the alloy is solidified and, therefore it is impossible to produce only silicon. Since the amount of silicon which can be produced corresponds to the composition difference in the liquidus line of the alloy that corresponds to the difference between the electrolysis temperature and the recovery temperature, a small difference between the recovery temperature and the electrolysis temperature means that a small amount of silicon can be produced, which is not economical. Thus, a preferable recovery temperature is generally slightly higher than the eutectic point.

For example, an alloy of aluminum-silicon maintains a liquid state at silicon concentrations of up to 55% at an electrolysis temperature of 1100° C. If the alloy is removed from the electrolytic vessel and cooled to 600° C., the silicon concentration needs to be reduced to 15%, so that silicon corresponding to the difference between them, that is, 40%, can be produced in a solid state.

The recovery method of silicon can be performed by using the known methods. Specifically, the methods such as holding the liquid alloy in a container at a recovery temperature and holding the liquid alloy in a container at a temperature slightly higher than a recovery temperature, immersing an object that is maintained at a recovery temperature in the liquid alloy whose temperature is slightly higher than the recovery temperature, which induces silicon deposition on the object.

Thus, the amount of silicon produced from the liquid alloy in which the silicon electrolyzed and reduced at a temperature is nearly saturated corresponds to the difference of the solubilities between the electrolyzed and reduced temperature and the recovery temperature.

As described above, the electrolytic reduction, the removal of the cathode alloy from the electrolytic vessel, the recovery by deposition, and the return of the liquid alloy having the reduced concentration of the silicon to the electrolytic vessel are performed in series. This can assist smoothness of reaction due to saturation of silicon in the section of the electrolytic reduction, so that the reaction proceeds as long as the fluidity of the alloy liquid can be maintained.

The recovery temperature of liquid alloy can be reduced to the eutectic point of the metal and silicon. In reality, however, a temperature equal to or higher than the melting point of the metal is preferable for the purpose of simple operation, as described later.

For example, aluminum has a melting point of 660° C. and Al—Si has a eutectic point around 580° C. Thus, the reaction is started in a molten state at 660° C. or higher, and as the reaction proceeds and silicon is produced, the liquid alloy temperature can be reduced to 580° C. since the liquid phase exists at the eutectic point or higher. At a temperature lower than 580° C., it is impossible to produce only silicon. The upper limit of the temperatures in the recovery section is not particularly limited, and any temperature can be used as long as the requirements for the temperature difference and the temperature in the section of the high-temperature electrolysis as described later are fulfilled.

The temperature difference between the high-temperature electrolysis section and the low-temperature recovery section of the liquid alloy is preferably large, and specifically, 100° C. or more, preferably 200° C. or more, and more preferably 300° C. or more.

From the viewpoint of the yield of reaction, a higher temperature in the high-temperature electrolysis section is preferable, and specifically, the temperature is 700° C. or higher, more preferably 900° C. or higher, and particularly preferably 1100° C. or higher. Since some limitations are imposed on the material of the electrolytic vessel and the like, the temperature in the high-temperature electrolysis section is preferably 1300° C. or lower.

According to the present inventions, it is possible to obtain silicon in an amount larger than 40% of the weight of aluminum to be used, and even larger than 45% thereof. Thus, a yield of the obtained silicon is high, thereby providing the economical advantages. In the methods according to the present inventions, the production amount is controlled by an electric current.

The material of the electrolytic vessel needs to be one which does not react with the metal to be used. For example, oxides to be used include silica, alumina, zirconia, titania, zinc oxide, magnesia, and tin oxide. Nitrides to be used include silicon nitride, aluminum nitride, and so on. It is possible to use one provided by partially substituting a different element for any of these constituent elements. For example, it is possible to use a compound such as sialon made of silicon, aluminum, oxygen, and nitrogen. Carbides include SiC, graphite, and so on, and it is possible to use one provided by partially substituting a different element for any of these constituent elements. It is possible to use the method in which a bath is maintained with a solidified electrolyte (for example, cryolite) similarly to aluminum electrolysis.

In the methods according to the present inventions, the reaction is performed in an atmosphere such as air or an inert gas. It is preferable that water or oxygen is not present for progression of the reaction.

Polycrystalline silicon obtained as described above has a high purity and is preferably used for a raw material of silicon for solar cells.

As required, the obtained polycrystalline silicon is subjected to treatment with acid and alkali to remove the attached remainder of the metal component or the unreacted metal component, segregation such as directional solidification, and solution in a high vacuum to reduce the impurity elements contained in silicon. Specifically, the obtained polycrystalline silicon can be subjected to directional solidification to achieve a higher purity.

Next, a solar cell using the polycrystalline silicon obtained in the present inventions will be described.

The silicon provided in the present inventions is used to produce an ingot using a cast method or an electromagnetic casting method. A substrate for the solar cell generally has a p-type conductivity. A dopant is introduced, for example, by adding boron or remaining aluminum. The ingot is sliced using an inner-blade cutting or a multi-wire saw. The slice is lapped over both surfaces as required by using free abrasive grain and is immersed into an etchant such as hydrofluoric acid to remove a damage layer, resulting in a polycrystal substrate. To reduce the loss of light reflection on the surface, a V-shaped groove is formed mechanically with a dicing machine, or a texture structure is formed by a reactive ion etching or an etching with acid or alkali. Subsequently, a diffusion layer including an n-type dopant such as phosphor or arsenic is formed on a light-receiving surface to provide a p-n junction. An oxide film layer such as $TiO_2$ is formed on the surface, an electrode is provided for each surface, and an anti-reflection film such as $MgF_2$ is formed to reduce the loss of light energy due to reflection, thereby providing a solar cell.

While the embodiments of the present inventions have been described above, the above embodiments of the present inventions are only illustrative and the scope of the present inventions is not limited to the embodiments. The scope of the present inventions is specified by the claims and encompasses all modifications within the meanings and ranges equivalent to the description of the claims.

EXAMPLES

Examples are shown to provide more detailed descriptions of the present inventions, but the present inventions are not limited thereto.

Example 1

Aluminum, cryolite, and silica were placed in a graphite crucible and were set in an electric furnace having a mullite furnace tube. Then, the liquids were electrolyzed at 1100° C.

After the electrolysis, the liquids were cooled to collect an alloy. The collected alloy could be dissolved with hydrochloric acid to obtain silicon. This alloy was once melted at 1100° C. and maintained at 700° C. for three hours. Then, the alloy was subjected to the solid-liquid separation to obtain a solid having a silicon concentration higher than that in the liquid and a liquid having a silicon concentration lower than that in the solid.

The liquid having the silicon concentration lower than that in the solid was returned to the electrolytic furnace to perform electrolysis of silica.

Example 2

While a quartz tube was inserted as a lining into a graphite crucible having a bottom area of 22 $cm^2$ along the inner wall, 132 g of cryolite (95%, manufactured by Central Glass Co., Ltd.), 7 g of silica powder (99.5%, manufactured by Alfa), and 43 g of aluminum particles (manufactured by Wako Pure Chemical Industries, Ltd.) were mixed, dried at 190° C. for two days, maintained at 1100° C. in an electric furnace for three hours under argon gas flow, and maintained at approximately 1000° C. A carbon rod having a diameter of 12 mm was set as an anode, and electrolysis was started after a predetermined temperature was reached. After the electrolysis for one hour with an electric current of 2.2 A, the sample was maintained for two hours without any electric current. Then, the melt was drained and the metal portion thereof was collected. It was found that 36.2 g of the alloy was collected. The collected alloy was dissolved in a concentrated hydrochloric acid and then analyzed by ICP. The analysis showed the production of an Al—Si alloy containing Si at 22 wt % or 7.96 g.

Then, 30 g of the alloy was placed again in the graphite crucible, maintained at 1000° C., melted, and then gradually cooled and maintained at 590° C. A graphite rod in which the internal temperature was cooled to 550° C. by nitrogen was immersed into the molten liquid and was pulled out after ten minutes. As a result of this, 2.7 g of silicon deposited to the graphite rod.

For reference, the same samples were placed with the same setups and maintained for three hours without any electric current. As a result, 37.2 g of an alloy was collected with a Si content of 19 wt % or 7.07 g. Silicon can be obtained since aluminum directly reduces silica. By using the numeric value as a reference, the substantial increase amount of Si due to electrolysis is calculated as 7.96 g-7.07 g=0.89 g. Since 0.57 g of Si is expected to be deposited in the calculation based on the amount of the electric current, a slight some error is present. However, it was found that the deposition of Si almost matches the amount of the electricity.

Example 3

In the same manner as in Example 2 except for an electrolyte current of 1.1 A, cryolite, silica, and aluminum were placed and electrolyzed for two hours and 15 minutes, and then maintained for one hour without any electric current. Then, 37.1 g of alloy was collected with a Si content of 21 wt %, i.e. 7.79 g.

Next, 30 g of the alloy was placed again in the graphite crucible, maintained at 1000° C., melted, and then gradually cooled and maintained at 590° C. A graphite rod in which the internal temperature was cooled to 550° C. by nitrogen was immersed into the molten liquid and was pulled out after ten minutes. As a result of this, 2.7 g of silicon deposited on the graphite rod.

In a reference experiment, 37.2 g of alloy was collected with a Si content of 19 wt %, i.e. 7.07 g. The substantial increase amount of Si due to the electrolysis is calculated as 7.79 g–7.07 g=0.72 g. Since 0.65 g of Si is expected to be deposited in the calculation based on the amount of the electricity, a slight error is present. However, it was found that the deposition of Si almost matches the amount of the passed electric current.

The invention claimed is:

1. A method for producing silicon by a molten salt electrolysis of silica in an electrolytic vessel with an electrolytic bath, comprising in order:
    a step (1) of using an alloy containing silicon in a liquid phase at an electrolysis temperature for a cathode and progressing the electrolysis to increase a content percentage of the silicon in the alloy;
    a step (2) of removing the alloy containing silicon in the cathode from the electrolysis vessel before the concentration of the silicon in the alloy becomes saturated at the electrolysis temperature;
    a step (3) of cooling the alloy containing silicon at temperatures higher than the eutectic point of the removed alloy containing silicon and lower than the electrolysis temperature to crystallize the silicon;
    a step (4) of collecting the solidified silicon,
    a step (5) of returning the alloy containing silicon in which the concentration of the silicon is reduced due to the collection of silicon at the step (4) to the cathode in the electrolytic vessel; and
    wherein the electrolysis temperature is higher than the eutectic point of the alloy containing silicon and lower than the melting point of silicon.

2. The method for producing a silicon according to claim 1, wherein the alloy contains at least one metal selected from the group consisting of aluminum, copper, and tin.

3. The method for producing silicon according to claim 1, wherein the electrolytic bath in the molten salt electrolysis contains cryolite ($3NaF.AlF_3$).

4. The method for producing silicon according to claim 1, wherein the alloy liquid containing silicon has a specific gravity higher than a specific gravity of the electrolytic bath.

5. The method for producing silicon according to claim 1, wherein the alloy liquid containing silicon has a specific gravity lower than a specific gravity of the electrolytic bath.

6. The method for producing silicon according to claim 1, wherein silica has a purity of 99.9% or higher.

7. The method for producing silicon according to claim 1, wherein the electrolysis temperature ranges from 700° C. to 1300° C.

8. The method for producing silicon according to claim 1, wherein anode current density ranges from 0.01 to 3 A/cm$^2$.

9. The method for producing silicon according to claim 1, wherein cathode current density ranges from 0.01 to 3 A/cm$^2$.

10. The method for producing silicon according to claim 1, wherein the alloy containing silicon is aluminum-silicon, and the electrolysis temperature ranges 900 or higher to 1100° C or lower.

11. The method for producing silicon according to claim 1, where the difference between the electrolysis temperature and the cooling temperature is 300° C. or more.

* * * * *